(12) United States Patent
Kourkoulos et al.

(10) Patent No.: US 8,448,115 B1
(45) Date of Patent: May 21, 2013

(54) THROUGH SILICON VIA IMPEDANCE EXTRACTION

(75) Inventors: Vasileios Kourkoulos, Grenoble (FR); Roberto Suaya, Meylan (FR)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/526,443

(22) Filed: Jun. 18, 2012

(51) Int. Cl.
*G06F 17/50* (2006.01)

(52) U.S. Cl.
USPC ............... 716/115; 716/52; 716/55; 716/111; 716/112; 716/113

(58) Field of Classification Search
USPC .............................. 716/110–115, 52, 55, 136
See application file for complete search history.

(56) References Cited

PUBLICATIONS

V. Kourkoulos and R. Suaya, "Electromagnetic Simulation of 3D ICs, Some Novelties Related to 3D Problems in Stratifed Media," Abstract, in Progress in Electromagnetics Research Symposium (PIERS), Jul. 2010.
Chuan Xu, Vassilis Kourkoulos, Roberto Suaya and Kaustav Banerjee, "A Fully Analytical Model for the Series Impedance of Through-Silicon Vias with Consideration of Substrate Effects and Coupling with Horizontal Interconnects," IEEE Transactions on Electron Devices, vol. 58, No. 10, pp. 3529-3540, Oct. 2011.
K. A. Michalski and D. Zheng, "Electromagnetic Scattering and Radiation by Surface of Arbitrary Shape in Layered Media, Part I: Theory," IEEE Trans. Antennas Propagat., vol. 38, No. 3, Mar. 1990.
K. A. Michalski and J. R. Mosig, "Multilayered Media Green's Functions in Integral Equation Formulations," IEEE Trans. Antennas and Propagation, vol. 45, No. 3, Mar. 1997.
N. Srivastava, R. Suaya, and K. Banerjee, "Efficient 3D High-frequency Impedance Extraction for General Interconnects and Inductors Above a Layered Substrate," Design, Automation & Test in Europe Conference & Exhibition, 2010, pp. 459-464.
V.N. Kourkoulos and A. C. Cangellaris, "Accurate Approximation of Green's Functions in Planar Stratified Media in Terms of a Finite Sum of Spherical and Cylindrical Waves," IEEE Trans. Antennas and Propagation, vol. 54, No. 5, May 2006.
R. Suaya , C. Xu , V Kourkoulos , K Banerjee, Z. Mahmood and L. Daniel, "Some Results Pertaining Electromagnetic Characterization and Model Building for Passive Systems including TSVs, for 3-D IC's Applications," IEEE Electrical Design of Advanced Packaging & Systems (EDAPS) Symposium, Hangzhou, China, Dec. 12-14, 2011.
Chuan Xu, Vassilis Kourkoulos, Roberts Suaya and Kaustav Banerjee, "A Fully Analytical Model for the Series Impedance of Through-Silicon Vias with Consideration of Substrate Effects adn Coupling with Horizontal Interconnects," IEEE Trasactions on Electron Devices, vol. 58, No. 10, pp. 3529-3540, Oct. 2011.
V. Kourkoulos and R. Suaya, "Electromagnetic Simulation of 3D ICs, Some Novelties Related to 3D Problems in Strati ed Media," Abstract, in Progress in Electromagnetics Research Symposium (PIERS), Jul. 2010.

*Primary Examiner* — Nha Nguyen (57) ABSTRACT

Aspects of the invention relate to techniques for extracting impedance values associated with through-silicon vias in an integrated circuit system. A function fitting process is performed to generate parameters of a representation for magneto-quasi-static dyadic vector potential Green's functions at a plurality of frequencies of interest based on integrated circuit manufacturing process information. Based on the generated parameters, a set of electric current basis functions and the layout information for a layout design of interest, matrix elements of a matrix for each frequency in the plurality of frequencies of interest may be computed. The matrix is a part of a linear system that formulates a relationship of electric current and electric potential difference in various regions associated with the through-silicon vias in the layout design. Based on the matrix, impedance values associated with the through-silicon vias are computed.

20 Claims, 4 Drawing Sheets

THROUGH SILICON VIA IMPEDANCE EXTRACTION

FIELD OF THE INVENTION

The present invention relates to the field of integrated circuit (IC) design and process technology. Various implementations of the invention may be particularly useful for extracting impedance values associated with through-silicon vias in an IC system.

BACKGROUND OF THE INVENTION

Three-dimensional integrated circuits (3-D ICs) have been shown to reduce on-chip global interconnect lengths and thus alleviate delay and power consumption problems. 3-D ICs can also facilitate the integration of dissimilar technologies (digital, analog, radio-frequency circuits, et al.). In a 3-D IC, multiple active layers or substrates are vertically stacked on top of each other and are interconnected using "short" vertical links. These "short" vertical links are referred to as through-silicon vias. Despite being "short", through-silicon vias have high aspect ratios: the radius of a through-silicon via may be in the order of several micrometers while its length is usually over 50 micrometers.

As fabrication technologies for through-silicon vias have progressed, accurate and efficient techniques for through-silicon via impedance extraction are needed for performance evaluation of circuits and systems built in 3-D ICs and for design optimization of 3-D IC interconnections. Conventional impedance extraction techniques may not be able to account for the unique location, size, and shape of through-silicon vias. For example, a significant portion of a through-silicon via is located inside the silicon substrate, increasing substrate effects significantly. The radii of through-silicon vias, in the order of several micrometers, could be comparable to the skin depth of copper even in relatively low frequencies such as hundreds of megahertz's. Some assumptions used in conventional techniques may thus become invalid. Moreover, the through-silicon via is not inside the same material, but inside a stack of layered materials. The effect of a single dipole inside the substrate cannot be written as a simple summation of dipoles inside a homogeneous space. Therefore, the z-dependence of the Green's functions cannot be easily extracted and the generation of impedance expressions is very cumbersome. In addition, through-silicon vias cannot be efficiently discretized in terms of rectangular filaments which are standard basis functions for two-dimensional impedance extraction. Accordingly, it is desirable to develop through-silicon via impedance extraction techniques that offer a good mix of speed, accuracy and generality.

BRIEF SUMMARY OF THE INVENTION

Aspects of the invention relate to techniques for extracting impedance values associated with through-silicon vias in an integrated circuit system. According to various implementations of the invention, a function fitting process may be performed to generate parameters of a representation for magneto-quasi-static dyadic vector potential Green's functions at a plurality of frequencies of interest based on the integrated circuit manufacturing process information. The integrated circuit manufacturing process information comprises electrical characteristics of multi-layer substrates in or through which through-silicon vias in a layout design are to be fabricated. The plurality of frequencies of interest may be determined based on a maximum frequency of interest received. The representation may use a summation involving Hankel funtions to represent an integral involving a diagonal element of the magneto-quasi-static dyadic vector potential Green's functions along a direction perpendicular to the multi-layer substrates. The generated parameters may be saved in a database or a library.

Based on the generated parameters, a set of electric current basis functions and the layout information for a layout design of interest, matrix elements of a matrix may be computed for each frequency in the plurality of frequencies of interest. The layout design of interest comprises through-silicon vias. The matrix is a part of a linear system that formulates a relationship of electric current and electric potential difference in various regions associated with the through-silicon vias. The set of electric current basis functions are cylindrical conduction mode basis functions. They may be formed by Bessel functions and trigonometric functions for solid through-silicon vias and by Hankel functions and trigonometric functions for hollow through-silicon vias.

Based on the matrix, impedance values associated with the through-silicon vias are computed. With various implementations of the invention, right-hand-side column vectors of the linear system for each frequency in the plurality of frequencies of interest may first be determined based on the set of electric current basis functions and voltage drops of the through-silicon vias. The linear system may then be solved to derive values for left-hand-side column vectors of the linear system for each frequency in the plurality of frequencies of interest. Finally, the impedance values for the through-silicon vias may be computed based on the values for the left-hand-side column vectors. In some embodiments of the invention, a non-linear least square fit may be performed to derive an impedance netlist based on the impedance values for the plurality of frequencies of interest.

The derived impedance values and/or the impedance netlist may be outputted. The outputting may comprise storing the impedance values in computer memory or storage.

DETAILED DESCRIPTION OF THE INVENTION

General Considerations

Various aspects of the present invention relate to extracting impedance values associated with through-silicon vias in an IC system. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "partition," "generate" and "associate" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

Figure 1:
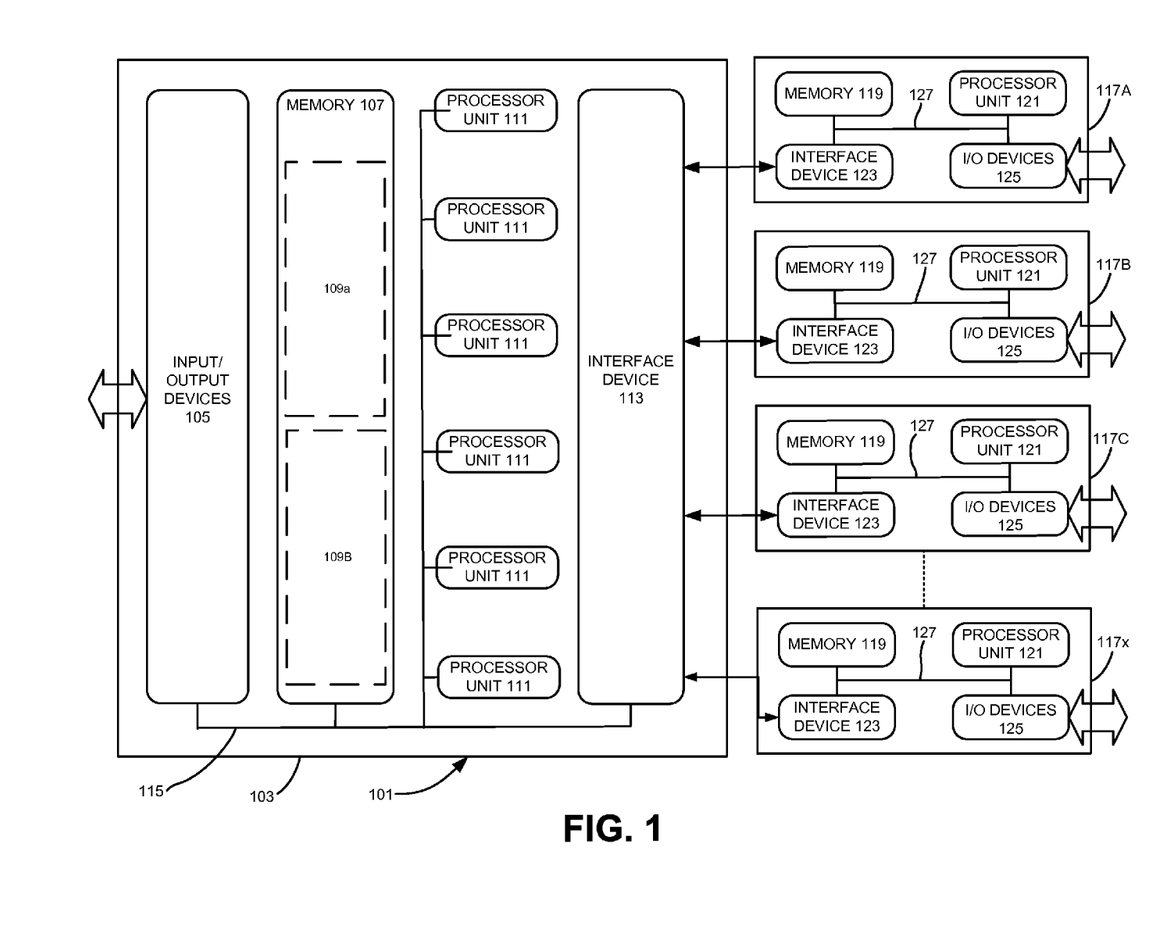
FIG. 1 illustrates an example of a computing system that may be used to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
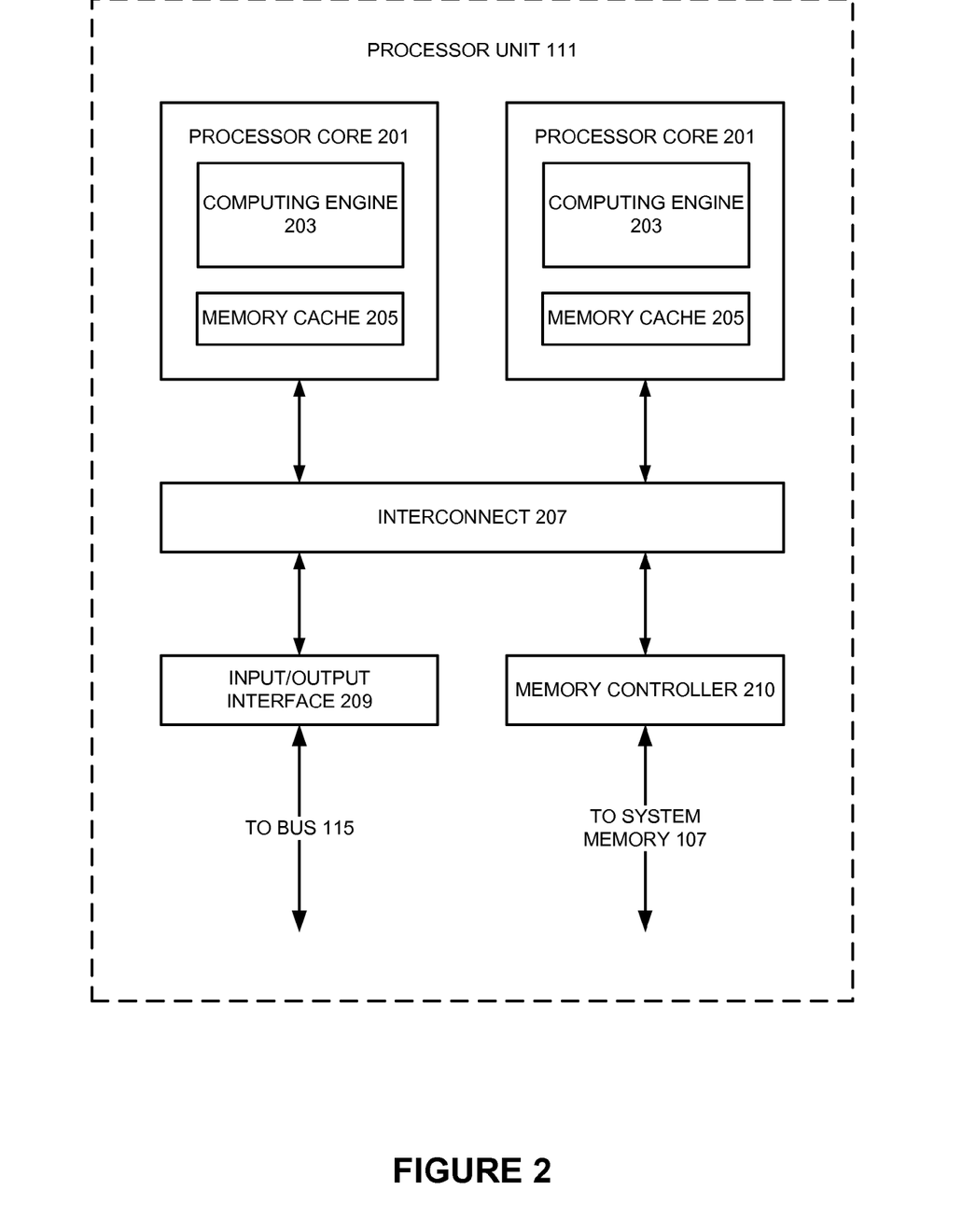
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Mixed Potential Formulation for Layered Media

Substrate effects may be treated using layered media Green's functions (LMGF). Formulation C in an article, authored by K. A. Michalksi, and D. Zheng, "Electromagnetic Scattering and Radiation by Surface of Arbitrary Shape in Layered Media, Part I: Theory," *IEEE Trans. Antennas Propagat.*, vol. 38, no. 3, March 1990, which is incorporated herein by reference, is an example:

$$\vec{E} = -j\omega\mu_0 \langle \overline{\overline{G}}^A ; \vec{J} \rangle + \frac{1}{j\omega\varepsilon_0} \nabla \langle K^\Phi, \nabla' \cdot \vec{J} \rangle. \quad (1)$$

In Equation (1), the electric field E is expressed as a summation of two components.

The first component corresponds to the vector potential produced by current sources and the second term corresponds to the scalar potential produced by charges. In the magneto-quasi-static regime, which is successfully used for resistance and inductance computations, the scalar potential simply serves as the excitation and the charges within the structure are ignored. The corrections, due to violations of this assumption, can be included in the capacitance calculations. Accordingly, equation (1) becomes:

$$\vec{E} = -j\omega\mu_0 \langle \overline{\overline{G}}^A ; \vec{J} \rangle - \nabla\Phi. \quad (2)$$

The current inside the body of the conductors is expressed in terms of a summation of electric current basis functions:

$$\vec{J} = \sum_{n=1}^{N} A_n \vec{B}_n(\vec{r}'). \quad (3)$$

The Ohm's law is utilized to express the field inside the volume of the conductors as a function of the current:

$$\vec{E}(\vec{r}) = \frac{\vec{J}(\vec{r})}{\sigma} = \sum_{n=1}^{N} A_n \frac{\vec{B}_n(\vec{r})}{\sigma}. \quad (4)$$

Substitution of equations (3) and (4) into equation (2) and use of Galerkin testing leads to:

$$\sum_{n=1}^{N} A_n \left\{ \left\langle \vec{B}_m(\vec{r}); \frac{\vec{B}_n(\vec{r})}{\sigma} \right\rangle + j\omega\mu_0 \langle \vec{B}_m(\vec{r}); \langle \overline{\overline{G}}^A ; \vec{B}_n(\vec{r}') \rangle \rangle \right\} = \quad (5)$$
$$\langle \vec{B}_m(\vec{r}); \nabla\Phi \rangle,$$

where m=1, 2, ..., N.

Upon a simple change of notation, equation (5) may be rewritten as:

$$\sum_{n=1}^{N} A_n \{R_{mn} + j\omega L_{mn}\} = V_m. \quad (6)$$

Equation (6) includes N equations for a total of N+K unknowns, where K is the number of voltage nodes in the structure. The remaining K unknowns could be determined by enforcing the voltage drop on the path to be equal to a fixed quantity, $V_0$ and, the conservation of charge which in this case is equivalent to the Kirchhoff current law at the voltage nodes. The solution of the linear system of equations shown in equation (6) yields values for the coefficients of the current, $A_n$, and the voltages at the nodes. These values could be used to calculate the total impedance of the loop.

Even though equation (6) looks similar to the one derived for homogeneous space, there are two fundamental differences. In the layered media case, the Green's functions for the vector potential is a tensor with non-zero off-diagonal components:

$$\overline{\overline{G}}^A = \begin{pmatrix} G_{xx}^A & 0 & G_{xz}^A \\ 0 & G_{yy}^A & G_{yz}^A \\ G_{zx}^A & G_{zy}^A & G_{zz,t}^A \end{pmatrix}. \quad (7)$$

Equation (7) implies that there is coupling between vertical and horizontal components of the current. To further investigate this behavior, the interaction of a z-directed basis function $B_n(\vec{r}')\hat{z}$ with a general basis function $\vec{B}_m(\vec{r})$ is considered. It is easily proven that this interaction could be written as:

$$L_{mn} = \mu_0 \langle \vec{B}_m(\vec{r}); \ \hat{z}\langle G_{zz}^A, B_n(\vec{r}') \rangle \rangle - \frac{1}{\omega^2\varepsilon_0} \langle \vec{B}_m(\vec{r}); \ \nabla\langle C^\Phi, B_n(\vec{r}') \rangle \rangle \quad (8)$$

where the exact expression for $C^\Phi$ is given in an article by K. A. Michalski, and J. R. Mosig, "Multilayered Media Green's Functions in Integral Equation Formulations," *IEEE Trans. Antennas and Propagation*, vol. 45, no. 3, March 1997 (referred to as Michalski 1997 hereinafter), which is incorporated herein by reference.

The second term of equation (8) is the term that includes the off-diagonal terms $G_{xz}^A$ and $G_{yz}^A$, of equation (7) and is responsible for the possible interactions between vertical and horizontal currents. This term through the use of standard vector identity could be written as:

$$L_{mn,off} = \quad (9)$$
$$-\frac{1}{\omega^2\varepsilon_0} \langle \nabla \cdot [\vec{B}_m(\vec{r}), \langle C^\Phi, B_n(\vec{r}') \rangle] \rangle + \frac{1}{\omega^2\varepsilon_0} \langle \nabla \cdot \vec{B}_m(\vec{r}), \langle C^\Phi, B_n(\vec{r}') \rangle \rangle$$

The first component of equation (9) is easily proven to be zero if $\vec{B}_m(\vec{r})$ has no normal component to the boundary surface at the boundary. The second term of equation (9) vanishes if the divergence of $\vec{B}_m(\vec{r})$ is equal to zero. Hence, under the above assumptions there will be no coupling between $B_n(\vec{r}')\hat{z}$ and $\vec{B}_m(\vec{r})$ through the off-diagonal terms of equation (7).

Therefore, $L_{mn,off}$ is zero for the current density. The current density, under magneto-quasi-static conditions, is always parallel to the surface of the conductors and has a zero divergence. This implies no coupling between a magneto-quasi-static current and a vertical current through the $G_{xz}^A$ and $G_{yz}^A$ elements of the vector potential tensor of equation (7) for a closed loop. Due to reciprocity, a similar behavior should dictate $G_{zx}^A$ and $G_{zy}^A$. Therefore, under magneto-quasi-static conditions, the effects of the off-diagonal terms of the vector potential tensor may be ignored.

The second difference of equation (6) compared with the free space equivalent is that the components of the dyadic vector potential Green's functions are not given in closed form. For instance, the $G_{zz}^A$ component is in the form of a Sommerfeld integral of zeroth order:

$$G_{zz}^A(\rho, z, z') = S_0\{\tilde{G}_{zz}^A(k_\rho, z, z')\}, \quad (10)$$

$$j\omega\mu_0 \tilde{G}_{zz}^A(k_\rho, z, z') = \frac{\mu_0 \mu_r}{\varepsilon_0 \varepsilon'_r} I_v^e, \quad (11)$$

$$S_n\{\tilde{f}(k_\rho)\} = \frac{1}{2\pi} \int_0^\infty \tilde{f}(k_\rho) J_n(k_\rho \rho) k_\rho \, dk_\rho. \quad (12)$$

The function $\tilde{G}_{zz}^A$ in equation (10) is the spatial Fourier transform in the xy-plane of $G_{zz}^A$, the function $I_v^e$ is a transmission line Green's function (TLGF) known in closed form (see Michalski 1997), and $J_n$ is the Bessel function of order n. The LMGF component $G_{zz}^A$ dictates the vertical to vertical interactions which dominate the impedance behavior of the through-silicon vias. The remaining two components of eq. (7), namely, $G_{xx}^A$ and $G_{yy}^A$ are also given in terms of Sommerfeld integrals. These two components, corresponding to the horizontal to horizontal interactions between conductors, have been given, for example, in an article by N. Srivastava, R. Suaya, and K. Banerjee, "Efficient 3D High-frequency Impedance Extraction for General Interconnects and Inductors Above a Layered Substrate," *Design, Automation & Test in Europe Conference & Exhibition*, 2010, pp. 459-464 (referred to as Srivastava herein after), which is incorporated herein by reference.

The introduction of the substrate effects through the use of the LMGFs adds some complexity to the formulations compared to the use of the homogeneous space Green's functions. The alternative, however, involves the homogeneous Green's function that requires the introduction of currents of the substrate as unknowns to the system. This may greatly increase the size of the problem.

Implementation of Substrates Effects

Vertical-to-vertical interactions are important elements of through-silicon via impedance calculations, especially so if both the basis function $\vec{B}_n(\vec{r})$ and the testing function $\vec{B}_m(\vec{r})$ are assumed to be z-directed. The vertical-to-vertical elements of the method of moments matrix is given by:

$$L_{mn,zz} = \mu_0 \langle B_m(\vec{r}), \langle G_{zz}^A, B_n(\vec{r}')\rangle\rangle. \quad (13)$$

The kernel $G_{zz}^A$ in equation (13) is a Sommerfeld integral; therefore the integral of equation (13) is a seven-dimensional one. The basis functions are assumed to be step wise constant in the z-direction:

$$B_m(\vec{r}) = \begin{cases} B_m(\vec{\rho}), & z_b < z < z_t \\ 0, & \text{otherwise} \end{cases} \quad (14)$$

Substitution of equations (14) and (10) into equation (13) along with a change of the order of integration leads to:

$$L_{mn,zz} = \mu_0 \int_{S_m} B_m(\vec{\rho}) \int_{S_m} B_n(\vec{\rho}') G_{zz,int}^A(|\vec{\rho}-\vec{\rho}'|) \, dS_n \, dS_m, \quad (15)$$

$$G_{zz,int}^A(\rho) = S_0\{\tilde{G}_{zz,int}^A(k_\rho)\}, \quad (16)$$

$$\tilde{G}_{zz,int}^A(k_\rho) \equiv \int_{z_{b,n}}^{z_{t,m}} \int_{z_{b,m}}^{z_{t,m}} \tilde{G}_{zz}^A(k_\rho, z, z') \, dz' \, dz. \quad (17)$$

The change of the order of integration enables the double integration of eq. (17) to be performed analytically and in a closed form:

$$\tilde{G}_{zz,int}^A(k_\rho) = -\frac{I_1(k_\rho, z_{t,m}, z_{b,m}, z_{t,n})}{k_z^2(k_\rho, z_{t,n})} + \frac{I_1(k_\rho, z_{t,m}, z_{b,m}, z_{b,n})}{k_z^2(k_\rho, z_{b,n})} - I_2(z_{t,m}, z_{b,m}, z_{t,n}, z_{b,n}), \quad (18)$$

where $$I_1(k_\rho, z_{t,m}, z_{b,m}, t) = \frac{j\omega\varepsilon_0\varepsilon_r(z_{t,m})\mu_r(z_{t,m})V_i^e(z_{t,m}, t)}{k_z^2(k_\rho, z_{t,m})} - \frac{j\omega\varepsilon_0\varepsilon_r(z_{b,m})\mu_r(z_{b,m})V_i^e(z_{b,m}, t)}{k_z^2(k_\rho, z_{b,m})} \quad (19)$$

$$I_2(k_\rho, z_{t,m}, z_{b,m}, z_{t,n}, z_{b,n}) = \begin{cases} \frac{\mu_r(z_{max})}{k_z^2(k_\rho, z_{max})}(z_{max}-z_{min}), & z_{max} > z_{min} \\ 0, & \text{otherwise} \end{cases} \quad (20)$$

$$z_{max} = \max\{z_{b,n}, z_{b,m}\}, \quad (21)$$

$$z_{min} = \min\{z_{t,n}, z_{t,m}\}. \quad (22)$$

For simplicity it was assumed that the basis do not cross any material interface. If this is not the case an equation similar to equation (18), even though much lengthier, could still be derived.

In V. N. Kourkoulos, and A. C. Cangellaris, "Accurate Approximation of Green's Functions in Planar Stratified Media in Terms of a Finite Sum of Spherical and Cylindrical Waves," *IEEE Trans. Antennas and Propagation*, vol. 54, no. 5, May 2006, which is incorporated herein by reference, a rational function fitting method is used to create fits of kernels of Sommerfeld integrals such that the Sommerfeld Integrals are given in closed forms. This idea is applied in equation (17). The spectrum of $\tilde{G}_{zz,int}^A$ in closed form, is obtained:

$$\tilde{G}_{zz,int}^A(k_\rho) \cong \sum_{l=1}^{L} \frac{\alpha_l}{k_\rho^2 - \beta_l^2}, \quad (23)$$

Substitution of equation (23) into equation (16) results in a closed form expression for the Sommerfeld integral of equation (16), in terms of a summation of Hankel functions of zeroth order and second kind:

$$G_{zz,int}^A(\rho) = -\frac{j}{4}\sum_{l=1}^{L} a_l H_0^{(2)}(\beta_l\rho). \tag{24}$$

Substitute equation (24) into equation (13):

$$L_{mn,zz} = -\frac{j\mu_0}{4}\sum_{l=1}^{L} a_l I_{mn}(\beta_l), \tag{25}$$

$$I_{mn}(\beta_l) \equiv \int_{S_m} B_m(\vec{\rho}) \int_{S_n} B_n(\vec{\rho}') H_0^{(2)}(\beta_l|\vec{\rho}-\vec{\rho}'|) dS_n dS_m \tag{26}$$

Equations (25) and (26) shows the seven-dimensional integral of eq. (13) which includes all the substrate effects can be reduced to a single summation of four-dimensional integrals, dependent upon the choice of the basis functions.

It should be pointed out that the aforementioned reduction of the integral dimensionality comes at the cost of a non-linear fit. This non-linear fit should be performed once for each possible combination of $z_{b,n}, z_{t,n}, z_{b,m}, z_{t,m}$ which appear in equation (17). Due to the nature of the problem, the possible combinations for the z-coordinates of the through-silicon vias are nonetheless limited. For the case of through-silicon vias buried in a substrate with extent in the z-direction from $z_{bot}$ to $z_{top}$, all the basis function regarding the through-silicon vias could be chosen to have $(z_{b,n}, z_{t,n})$ equal to $(z_{bot}, z_{top})$. Accordingly, only one non-linear fit may be needed even if many through-silicon vias exist inside the substrate. Further reductions of the dimensionality of integrals may be possible by making a choice regarding the basis functions, which will be discussed in the next section.

Electric Current Basis Functions for Through-Silicon Vias

The choice of the basis functions used in the method of moments can affect both the accuracy and the efficiency of the solution. It has been shown, in cases where conduction mode basis functions are used to represent the currents inside the conductors, that the closer the basis functions are to the actual solution, the lower the number of the basis functions will be required for a given accuracy. The downside of conduction mode basis functions is that the elements of the method of moments matrix are multi-dimensional integrals with complex kernels often computable only through numerical integration. With various implementations of the invention, cylindrical conduction mode basis functions are used and the elements of the method of moments matrix are computed in a closed form.

The current inside a through-silicon via may be expressed as follows:

$$\vec{B}_n(\vec{\rho}') = \hat{z}\begin{cases} \Theta_q(k_{c,b}\rho_b)\cos(q\varphi_b) \\ \text{or} \\ \Theta_q(k_{c,b}\rho_b)\sin(q\varphi_b), \end{cases} \tag{27}$$

where $\rho_b, \varphi_b$ are the polar coordinates of $\vec{\rho}'$ with respect to the cylindrical coordinate system at the center of the through-silicon via, and $k_{c,b}$ is the wavenumber of the conductive material of the respective through-silicon via. The functions $\Theta_q(z)$ are chosen in such a way that the basis functions are eigenfunctions of the Helmholtz equation in cylindrical coordinates for the case of no z-dependence. More specifically, they are the Bessel Functions of order q for the case of a solid through-silicon via, and Hankel functions of order q (both first and second kind) for the case of a hollow through-silicon via. The parameter q is a nonnegative integer for the basis function with cosine and strictly positive for the case of the basis function with the sine.

The current inside a solid through-silicon via may be represented as a summation of only Bessel functions because the rest of the eigenfunctions (Neumann and Hankel) result to singularities at the axis of the through-silicon via, which is a non-physical result. The eigenfunctions having a z-dependence were omitted by the formulation since they add unnecessary complexity. If the vertical current of the through-silicon via has a strong z-dependence, which is a possibility in the case of strong capacitive effects on the through-silicon via, the length of the through-silicon via could be further divided into more basis functions to simulate a "step-like" behavior of the current along the z axis.

The behavior of the cylindrical conduction mode basis functions is consistent with the behavior of the current inside the through-silicon via in the low and the high frequency limits. In the low frequency limit, $k_c r_b \to 0$, the main contribution comes from the basis function proportional to $J_0(k_c\rho_b)$ which approaches unity as the argument reduces to zero. This is the case of the through-silicon via having a uniform current density throughout its cross-section for low frequency. For high frequencies where the radius of the through-silicon via is larger than the skin depth, the behavior of the Bessel function exhibits an exponential behavior.

Besides being physically consistent, the cylindrical conduction mode basis functions can lead to closed-form calculation of the elements of the method of moments matrix. The derivation for the closed form expressions of equations (25) and (26) needs extensive use of the addition theorem for Bessel functions. Suppose that the basis function is given by the expression:

$$\vec{B}_m(\vec{\rho}') = \hat{z}\Theta_q(k_{c,b}\rho_b)\cos(q\varphi_b). \tag{28}$$

And the testing function by the expression:

$$\vec{B}_n(\vec{\rho}) = \hat{z}\Xi_p(k_{c,t}\rho_t)\cos(p\varphi_t), \tag{29}$$

where $\Theta$ and $\Xi$ represent any of the Bessel functions. In this case eq. (26) will be given by:

For Basis Functions belong to the same TSV, $$I_{mn}(\beta_l) = 2(\pi)^2 I_A(J, \Theta, q, \beta_l, k_{c,b}, a_b, b_b) \cdot \tag{30}$$
$$I_A(J, \Xi, p, \beta_l, k_{c,t}, a_t, b_t) \cdot [H_{q-p}^{(2)}(\beta_l\rho_{dif})\cos[(q-p)\varphi_{dif}] + $$
$$(-1)^p H_{q+p}^{(2)}(\beta_l\rho_{dif})\cos[(q+p)\varphi_{dif}]]$$

For Basis Functions belong to different TSVs, $$I_{mn}(\beta_l) = \tag{31}$$
$$2\pi^2\delta_{qp}\varepsilon_q\{I_A(\Xi, J, q, k_{c,t}, \beta_l, a_t, b_t)I_B(q, H^{(2)}, \Theta, \beta_l, k_{c,b}, b_b) - $$
$$I_A(\Xi, H^{(2)}, q, k_{c,t}, \beta_l, a_t, b_t)I_B(q, J, \Theta, \beta_l, k_{c,b}, a_b) + $$
$$I_A(\Xi, \Theta, q, k_{c,t}, k_{c,b}, a_t, b_t)I_C(\beta_l, k_{c,b})\}$$

where $\vec{\rho}_{dif}$ is the vector parallel to the xy-plane that connects the center of the two TSVs, $\vec{\varphi}_{dif}$ is the angle formed by $\vec{\rho}_{dif}$ and the x-axis, and the quantities $I_A$, $I_B$, $I_C$, are given by the expressions:

$$I_A(l, \Xi, \Theta, \beta_l, k_{c,b}, a_b, b_b) \equiv \qquad (32)$$

$$I_B(l, \Xi, \Theta, \beta_l, k_{c,b}, b_b) - I_B(l, \Xi, \Theta, \beta_l, k_{c,b}, a_b)$$

$$I_B(l, \Xi, \Theta, \beta_l, k_{c,b}, a_b) \equiv \qquad (33)$$
$$\frac{1}{\beta_l^2 - k_{c,b}^2}[\beta_l a_b \Xi_{l+1}(B_l a_b)\Theta_l(k_{c,b}a_b) - k_{c,b}a_b\Xi_l(\beta_l a_b)\Theta_{l+1}(k_{c,b}a_b)]$$

$$I_C(\beta_l, k_{c,b}) \equiv -\frac{2j}{\pi}\frac{1}{\beta_l^2 - k_{c,b}^2}, \qquad (34)$$

$$\varepsilon_q = \begin{cases} 2, & q = 0 \\ 1, & \text{otherwise,} \end{cases} \qquad (35)$$

$$\delta_{qp} = \begin{cases} 1, & q = p \\ 0, & \text{otherwise,} \end{cases} \qquad (36)$$

The expressions for the case where both the basis and the testing function have a sine φ dependence or the case where one of them has cosine and the other has sine dependence are quite similar.

Impedance Extraction Tools and Methods

Figure 3:
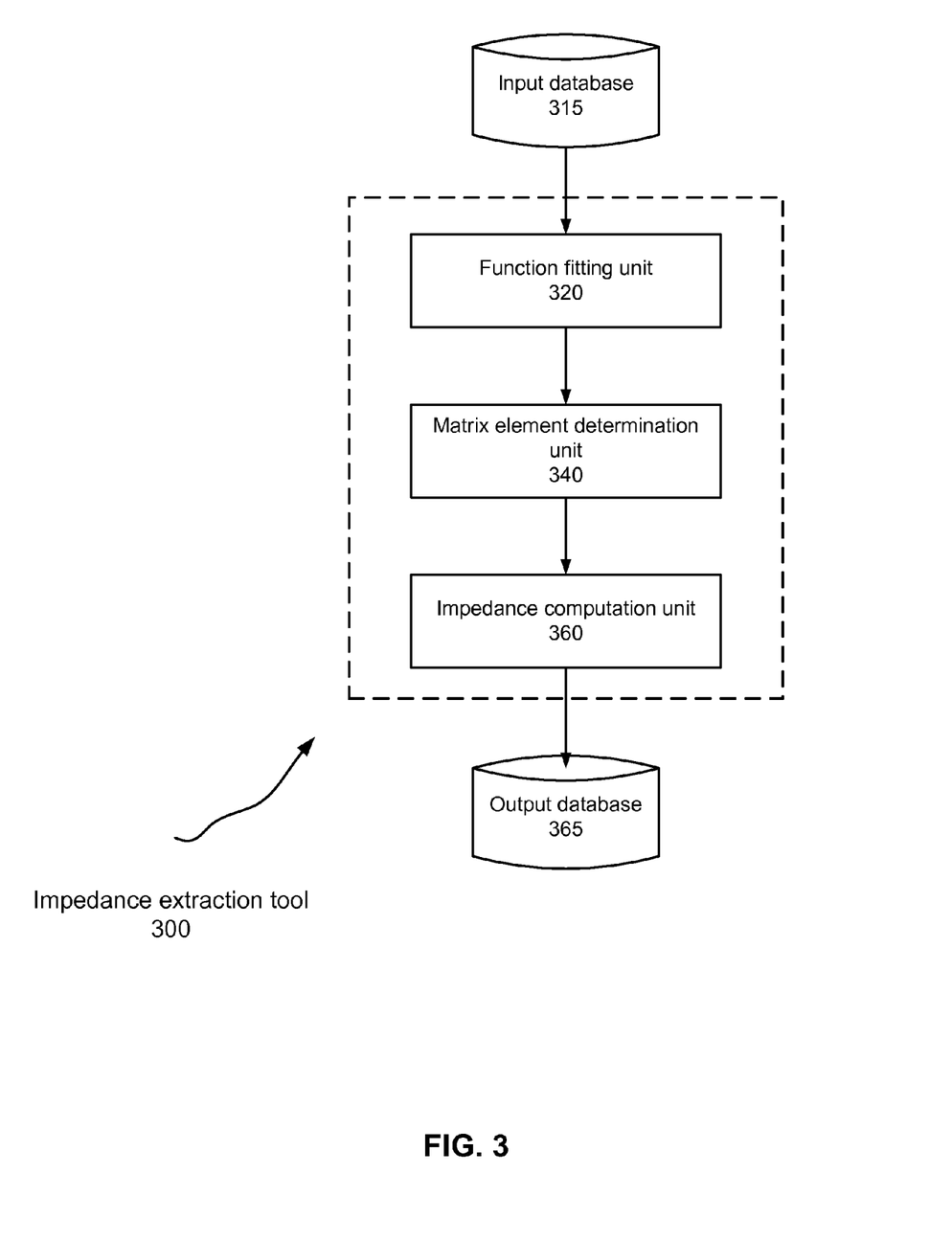
FIG. 3 illustrates an impedance extraction tool that may be employed according to various embodiments of the invention.

FIG. 3 illustrates an example of an impedance extraction tool according to various embodiments of the invention. As seen in the figure, the impedance extraction tool 300 includes three units: a function fitting unit 320, a matrix element determination unit 340, and an impedance computation unit 360. As will be discussed in more detail below, some implementations of the impedance extraction tool 300 may cooperate with (or incorporate) one or both of an input database 315 and an output database 365. While the input database 315 and the output database 365 are shown as separate units in FIG. 3, a single data storage medium may be used to implement some or all of these databases.

According to some embodiments of the invention, one or more of the function fitting unit 320, the matrix element determination unit 340, and the impedance computation unit 360 may be implemented by executing programming instructions on one or more programmable computers/computer systems, such as the computing system illustrated in FIG. 1 and FIG. 2. Correspondingly, some other embodiments of the invention may be implemented by software instructions, stored on a non-transitory computer-readable medium, for instructing one or more programmable computers/computer systems to perform the functions of one or more of the function fitting unit 320, the matrix element determination unit 340, and the impedance computation unit 360. As used herein, the term "non-transitory computer-readable medium" refers to computer-readable medium that are capable of storing data for future retrieval, and not propagating electromagnetic waves. The non-transitory computer-readable medium may be, for example, a magnetic storage device, an optical storage device, a "punched" surface type device, or a solid state storage device.

Figure 4:
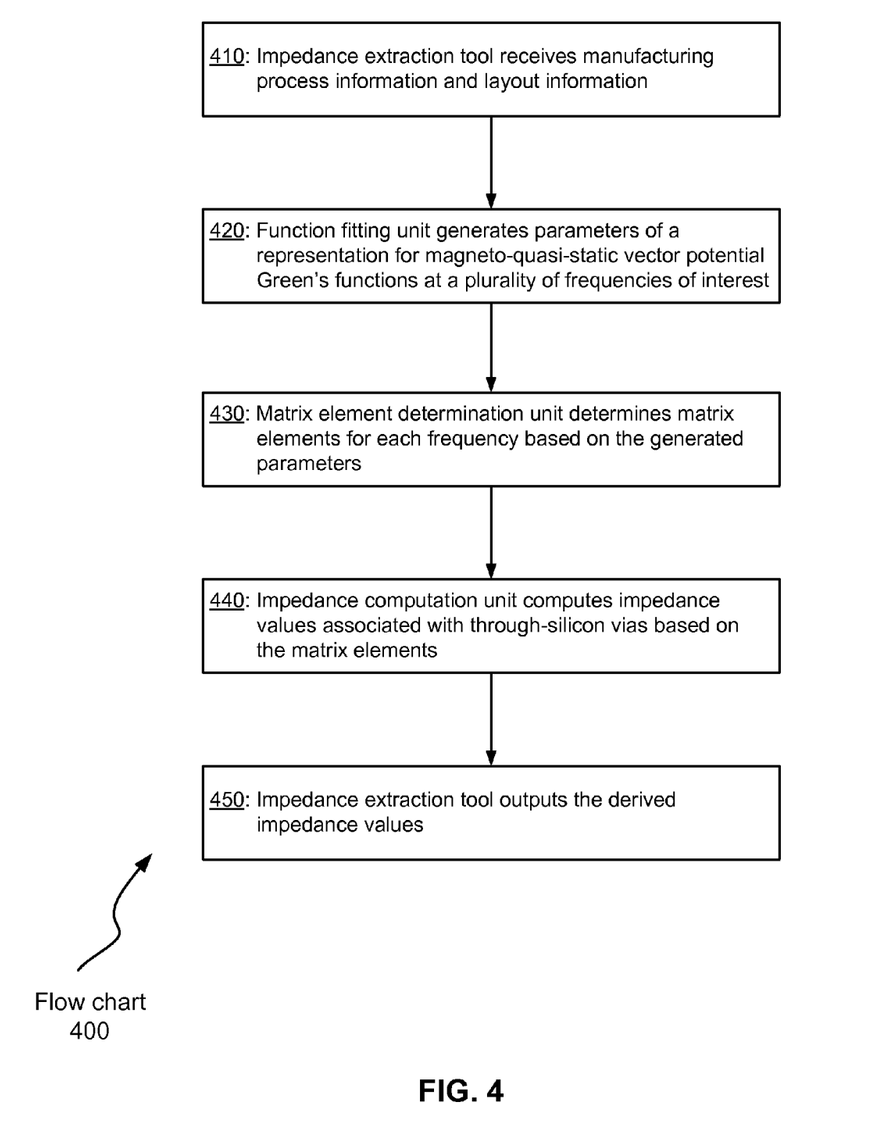
FIG. 4 illustrates a flowchart describing methods for impedance extraction that may be employed by various embodiments of the invention.

For ease of understanding, impedance extraction methods that may be employed according to various embodiments of the invention will be described with reference to the impedance extraction tool 300 illustrated in FIG. 3 and the impedance extraction method shown in the flow chart 400 in FIG. 4. It should be appreciated, however, that alternate implementations of an impedance extraction tool may be used to the impedance extraction method shown in the flow chart 400 according to various embodiments of the invention. In addition, it should be appreciated that implementations of the impedance extraction tool 300 may be employed with other methods for impedance extraction according to different embodiments of the invention.

Initially, in operation 410, the impedance extraction tool 300 receives integrated circuit manufacturing process information and layout information of a layout design. The integrated circuit manufacturing process information comprises material properties such as electrical characteristics of multi-layer substrates in or through which through-silicon vias in the layout design are to be fabricated. Different circuits may be fabricated using the same type of multi-layer substrates. Thus, this information may be used for through-silicon vias impedance extraction of other layout designs. The integrated circuit manufacturing process information and layout information may be received concurrently. Alternatively, the layout information may be received later when needed.

Next, in operation 420, the function fitting unit 320 performs a function fitting process to generate parameters of a representation for magneto-quasi-static dyadic vector potential Green's functions at a plurality of frequencies of interest based on the integrated circuit manufacturing process information. The representation uses a summation involving Hankel funtions to represent an integral involving a diagonal element of the magneto-quasi-static dyadic vector potential Green's functions along a direction perpendicular to the multi-layer substrates (the z direction). Equation (24) is an example of such an representation: the integral of the z diagonal element of the magneto-quasi-static dyadic vector potential Green's functions $G_{zz}^A$ equals a summation of L Hankel functions of zeroth order and second kind $H_0^{(2)}$. The parameters of the representation, $\alpha_i$ and $\beta_i$, may be obtained based on function-fitting of the Fourier transform of the z diagonal element of the magneto-quasi-static vector potential Green's function, $\tilde{G}_{zz,int}^A$, which has a closed analytic form in equation (23). This fitting process may be performed for each possible combination of $z_{b,n}$, $z_{t,n}$, $z_{b,m}$, $z_{t,m}$ shown in equation (17).

A detailed explanation of the rational function fitting method may be found in Kourkoulos. As noted earlier, the function fitting process depends on the material properties of the multilayered structure and the frequency included in the integrated circuit manufacturing process information. A library or a database containing the parameters for each multilayered structure may be created for processing different circuit designs. This can reduce the computational cost of the through-silicon via impedance extraction.

Next, in operation 430, the matrix element determination unit 340 matrix elements of a matrix for each frequency in the plurality of frequencies of interest based on the generated parameters, a set of electric current basis functions and the layout information. The set of electric current basis functions are cylindrical conduction mode basis functions. The matrix is a part of a linear system that formulates a relationship of electric current and electric potential difference in various regions associated with the through-silicon vias. Equation (5) is an example of the linear system of which the left hand side includes the matrix shown in equation (7). To determine the diagonal matrix element along the z-direction, the matrix element determination unit 340 may select functions shown in equation (27) as the set of electric current basis functions. For basis functions belong to the same through-silicon via, the matrix element can be computed in a closed form based on equations (30), (32)-(26). For basis functions belong to different through-silicon vias, the matrix element can be computed in a closed form based on equations (31), (32)-(26). The other diagonal elements, corresponding to horizontal-to-horizontal interactions, may be computed according to methods described in Srivastava. The vertical-to-vertical interations, however, are more important to—through-silicon impedance calculation.

Next, in operation 440, the impedance computation unit 360 computes impedance values associated with the through-silicon vias based on the matrix. With various implementations of the invention, the impedance computation unit 360 may first compute the right-hand-side column vectors of equation (5) based on the set of electric current basis functions and voltages of the through-silicon vias. Each of the right-hand-side column vectors corresponds to voltage drop at one through-silicon vias being set at 1 volt and voltage drops at the rest being set at 0. As the matrix is known, the linear system may be solved using conventional linear algebra methods.

The operations 430 and 440 may be performed consecutively for each frequency of interest. Alternatively, the operation 430 may be performed for all of the plurality of frequencies of interest before the operation 440 is performed.

In operation 450, the impedance extraction tool 300 outputs the impedance values. For example, the impedance values can be stored in one or more computer-readable storage media (e.g., volatile or nonvolatile memory or storage), e.g., the output database 365 in FIG. 3.

In some embodiments of the invention, the impedance extraction tool 300 may also perform a non-linear least square fit to derive an impedance netlist based on the impedance values for the plurality of frequencies of interest.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, cylindrical through-silicon vias are used as examples for impedance extractions. The methods disclosed here may be applied to other structures similar to cylindrical through-silicon vias such as cylindrical copper pillars.

What is claimed is:

1. One or more non-transitory processor-readable storage media storing computer-executable instructions for causing one or more processors to perform a method, the method comprising:
   receiving integrated circuit manufacturing process information and layout information of a layout design, the integrated circuit manufacturing process information comprising electrical characteristics of multi-layer substrates in or through which through-silicon vias in the layout design are to be fabricated;
   performing a function fitting process to generate parameters of a representation for magneto-quasi-static dyadic vector potential Green's functions at a plurality of frequencies of interest based on the integrated circuit manufacturing process information, the representation using a summation involving Hankel funtions to represent an integral involving a diagonal element of the magneto-quasi-static dyadic vector potential Green's functions along a direction perpendicular to the multi-layer substrates;
   computing matrix elements of a matrix for each frequency in the plurality of frequencies of interest based on the generated parameters, a set of electric current basis functions and the layout information, the set of electric current basis functions being cylindrical conduction mode basis functions, the matrix being a part of a linear system that formulates a relationship of electric current and electric potential difference in various regions associated with the through-silicon vias;
   computing impedance values associated with the through-silicon vias based on the matrix elements; and
   outputting the impedance values.

2. The one or more non-transitory processor-readable storage media recited in claim 1, wherein the set of electric current basis functions include Bessel functions and trigonometric functions for solid through-silicon vias and Hankel functions and trigonometric functions for hollow through-silicon vias.

3. The one or more non-transitory processor-readable storage media recited in claim 1, wherein the computing impedance values comprises:
   determining right-hand-side column vectors of the linear system for each frequency in the plurality of frequencies of interest based on the set of electric current basis functions and voltage drops of the through-silicon vias; and
   solving the linear system to compute impedance values for the through-silicon vias.

4. The one or more non-transitory processor-readable storage media recited in claim 1, wherein the method further comprises:
   performing a non-linear least square fit to derive a impedance netlist based on the impedance values for the plurality of frequencies of interest.

5. The one or more non-transitory processor-readable storage media recited in claim 1, wherein the plurality of frequencies of interest is determined based on a maximum frequency of interest received.

6. The one or more non-transitory processor-readable storage media recited in claim 1, wherein the outputting comprises storing the impedance values in computer memory or storage.

7. The one or more non-transitory processor-readable storage media recited in claim 1, wherein the method further comprises:
   storing the generated parameters in a database.

8. A method of impedance extraction, comprising:
   with a computer,
      receiving integrated circuit manufacturing process information and layout information of a layout design, the integrated circuit manufacturing process information comprising electrical characteristics of multi-layer substrates in or through which through-silicon vias in the layout design are to be fabricated;

performing a function fitting process to generate parameters of a representation for magneto-quasi-static dyadic vector potential Green's functions at a plurality of frequencies of interest based on the integrated circuit manufacturing process information, the representation using a summation involving Hankel funtions to represent an integral involving a diagonal element of the magneto-quasi-static dyadic vector potential Green's functions along a direction perpendicular to the multi-layer substrates;

computing matrix elements of a matrix for each frequency in the plurality of frequencies of interest based on the generated parameters, a set of electric current basis functions and the layout information, the set of electric current basis functions being cylindrical conduction mode basis functions, the matrix being a part of a linear system that formulates a relationship of electric current and electric potential difference in various regions associated with the through-silicon vias;

computing impedance values associated with the through-silicon vias based on the matrix elements; and outputting the impedance values.

9. The method recited in claim 8, wherein the set of electric current basis functions include Bessel functions and trigonometric functions for solid through-silicon vias and Hankel functions and trigonometric functions for hollow through-silicon vias.

10. The method recited in claim 8, wherein the computing impedance values comprises:

determining right-hand-side column vectors of the linear system for each frequency in the plurality of frequencies of interest based on the set of electric current basis functions and voltage drops of the through-silicon vias; and solving the linear system to compute impedance values for the through-silicon vias.

11. The method recited in claim 8, further comprising:
performing a non-linear least square fit to derive a impedance netlist based on the impedance values for the plurality of frequencies of interest.

12. The method recited in claim 8, wherein the plurality of frequencies of interest is determined based on a maximum frequency of interest received.

13. The method recited in claim 8, wherein the outputting comprises storing the impedance values in computer memory or storage.

14. The method recited in claim 8, further comprising:
storing the generated parameters in a database.

15. A system, comprising:
one or more processors, the one or more processors programmed to perform a method of impedance extraction, the method comprising:

receiving integrated circuit manufacturing process information and layout information of a layout design, the integrated circuit manufacturing process information comprising electrical characteristics of multi-layer substrates in or through which through-silicon vias in the layout design are to be fabricated;

performing a function fitting process to generate parameters of a representation for magneto-quasi-static dyadic vector potential Green's functions at a plurality of frequencies of interest based on the integrated circuit manufacturing process information, the representation using a summation involving Hankel funtions to represent an integral involving a diagonal element of the magneto-quasi-static dyadic vector potential Green's functions along a direction perpendicular to the multi-layer substrates;

computing matrix elements of a matrix for each frequency in the plurality of frequencies of interest based on the generated parameters, a set of electric current basis functions and the layout information, the set of electric current basis functions being cylindrical conduction mode basis functions, the matrix being a part of a linear system that formulates a relationship of electric current and electric potential difference in various regions associated with the through-silicon vias;

computing impedance values associated with the through-silicon vias based on the matrix elements; and outputting the impedance values.

16. The system recited in claim 15, wherein the set of electric current basis functions include Bessel functions and trigonometric functions for solid through-silicon vias and Hankel functions and trigonometric functions for hollow through-silicon vias.

17. The system recited in claim 15, wherein the computing impedance values comprises:

determining right-hand-side column vectors of the linear system for each frequency in the plurality of frequencies of interest based on the set of electric current basis functions and voltage drops of the through-silicon vias; and solving the linear system to compute impedance values for the through-silicon vias.

18. The system recited in claim 15, wherein the method further comprises:
performing a non-linear least square fit to derive a impedance netlist based on the impedance values for the plurality of frequencies of interest.

19. The system recited in claim 15, wherein the plurality of frequencies of interest is determined based on a maximum frequency of interest received.

20. The system recited in claim 15, wherein the outputting comprises storing the impedance values in computer memory or storage.

* * * * *